United States Patent
You

(10) Patent No.: US 10,535,418 B2
(45) Date of Patent: Jan. 14, 2020

(54) MEMORY DEVICE INCLUDING REPAIR CIRCUIT AND OPERATION METHOD THEREOF

(71) Applicant: SK hynix Inc., Gyeonggi-do (KR)

(72) Inventor: Jung-Taek You, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 126 days.

(21) Appl. No.: 15/806,559

(22) Filed: Nov. 8, 2017

(65) Prior Publication Data

US 2018/0308563 A1    Oct. 25, 2018

(30) Foreign Application Priority Data

Apr. 21, 2017   (KR) .................. 10-2017-0051611

(51) Int. Cl.
   *G11C 29/00*   (2006.01)
   *G11C 29/44*   (2006.01)
   *G11C 29/38*   (2006.01)

(52) U.S. Cl.
   CPC .......... *G11C 29/4401* (2013.01); *G11C 29/38* (2013.01)

(58) Field of Classification Search
   None
   See application file for complete search history.

(56) References Cited

U.S. PATENT DOCUMENTS

| | | | | |
|---|---|---|---|---|
| 2004/0208067 A1* | 10/2004 | Lee | ............. | G11C 29/806 365/200 |
| 2008/0043549 A1* | 2/2008 | Kim | ............. | G11C 29/783 365/200 |
| 2011/0149665 A1* | 6/2011 | Koo | ............. | G11C 17/16 365/200 |
| 2012/0120737 A1* | 5/2012 | Kim | ............. | G11C 17/14 365/189.07 |
| 2014/0169059 A1* | 6/2014 | Kong | ............. | G11C 29/785 365/96 |
| 2015/0043288 A1* | 2/2015 | Kim | ............. | G11C 17/14 365/189.05 |
| 2016/0351276 A1* | 12/2016 | Shim | ............. | G11C 29/78 |
| 2017/0083398 A1* | 3/2017 | Baek | ............. | G11C 29/44 |

FOREIGN PATENT DOCUMENTS

| KR | 1020160016367 | 2/2016 |
|---|---|---|
| KR | 1020160074211 | 6/2016 |

* cited by examiner

*Primary Examiner* — Daniel F. McMahon
(74) *Attorney, Agent, or Firm* — IP & T Group LLP

(57) ABSTRACT

A memory device including a memory cell region having a normal cell array and a redundant cell array, a fuse unit having a plurality of fuse sets corresponding to the redundant cell array and which is used for programming an address of a repair target memory cell of the normal cell array and a deciding unit which determines fuse sets that are used in a first operation mode according to a control signal.

20 Claims, 7 Drawing Sheets

MEMORY DEVICE INCLUDING REPAIR CIRCUIT AND OPERATION METHOD THEREOF

CROSS-REFERENCE TO RELATED APPLICATIONS

The present application claims priority of Korean Patent Application No. 10-2017-0051611, filed on Apr. 21, 2017, which is incorporated herein by reference in its entirety.

BACKGROUND

1. Field

Exemplary embodiments of the present invention relate to a memory device and, more particularly, to a memory device capable of performing a post-package repair operation.

2. Description of the Related Art

A semiconductor memory device, e.g., a Dynamic Random Access Memory (DRAM) device, may include a plurality of memory cells that are arrayed in a matrix form. As the memory capacitance of a semiconductor memory device is increased and microfabrication process advances, the number of failure memory cells among the memory cells may be increased as well. The failure memory cells may include defective memory cells and weak memory cells. The defective memory cells may represent memory cells that are defective in terms of hardware. The defective memory cells are memory cells that do not operate normally due to a failure occurring in the course of a fabrication process. For example, the defective memory cells are memory cells where a short circuit or line disconnection occurs. The weak memory cells may be memory cells that are defective in terms of software. For example, the weak memory cells may include memory cells whose data retention time is shorter than a reference time.

However, if a defect occurs even in one memory cell among the memory cells, the semiconductor memory device may not perform an operation normally and the semiconductor memory device may be regarded as a defective semiconductor memory device. A defective semiconductor memory device has to be abandoned. When a semiconductor memory device which includes a defective memory cell is abandoned as a defective semiconductor memory device, the manufacturing yield drops significantly which in turn increases the per unit cost. Moreover, as memory cells are highly integrated and the number of memory cells that are integrated in one chip is tens of millions or more, the possibility that there are failure memory cells in a chip becomes high despite the advancement of the fabrication processes which are used to make the chips.

Therefore, for improving the yield and for raising the integration and operation rate of a semiconductor memory device, researchers and the industry are developing technologies for efficiently repairing failure memory cells. Among the technologies for repairing failure memory cells is a technology which includes a repair circuit for substituting a failure memory cell with a redundant memory cell. The repair circuit is provided with a fuse circuit for programming an address corresponding to a failure memory cell. Herein, "programming" may mean a series of operations for storing an address corresponding to a failure memory cell in the fuse circuit.

Meanwhile, a repair method for repairing a failure memory cell in a DRAM device may include a method of performing a repair operation in the stage of a wafer and a repair operation in the stage of a package. Herein, the wafer-stage repair method may include performing a test operation, detecting a failure memory cell, and substituting the detected failure memory cell with a redundant memory cell during the fabrication process. The package-stage repair method may include detecting a failure memory cell and substituting the detected failure memory cell with a redundant memory cell after the fabrication process.

After a DRAM device is produced, in order to cope with a situation that a failure memory cell is detected while a user is using the DRAM device, the DRAM device may support a Post-Package Repair (PPR) function. Accordingly, the DRAM device could be saved despite the presence of the failure memory cell. To support the PPR function, the DRAM device may have to include PPR-dedicated redundant memory cells that may normally operate for each bank group or each bank, and fuse sets for using the PPR-dedicated redundant memory cells. Therefore, the fuse circuit may include a plurality of fuse sets, and the fuse sets may include a fuse set to be used during a fabrication process and a fuse set to be used in a PPR mode. Although the failure memory cells detected during the fabrication process are all repaired and operate normally, the DRAM device may not come to the market if there are no available PPR-dedicated redundant memory cells and fuse sets for the PPR function.

Moreover, since a failure in the memory cells of a DRAM device occurs randomly, the failure may occur in the PPR-dedicated redundant memory cells. The PPR function may not be supported if the failure may occur in the PPR-dedicated redundant memory cells. Since the types of failure occurring in the memory cells are diverse according to the development of technology for fabricating a DRAM device, it is required to variably select the number of fuse sets for supporting the PPR function according to the maturity of the technology development and the need of a manufacturer.

SUMMARY

Exemplary embodiments of the present invention are directed to a memory device and an operation method thereof for managing the fuse sets of the memory device according to an operation mode of the memory device In accordance with an embodiment of the present invention, a memory device includes: a memory cell region that includes a normal cell array and a redundant cell array; a fuse unit that includes a plurality of fuse sets corresponding to the redundant cell array, for programming an address of a repair target memory cell of the normal cell array; and a deciding unit suitable for determining fuse sets that are used in a first operation mode, among the plurality of the fuse sets, according to a control signal.

In accordance with another embodiment of the present invention, a repair circuit includes: a fuse unit that includes a plurality of fuse sets for programming an address of a defective memory cell among a plurality of memory cells; a storage unit suitable for storing information indicating whether the fuse sets have a failure and whether the fuse sets are used or not; a deciding unit suitable for determining a predetermined number of fuse sets among the plurality of the fuse sets, according to a control signal; and a repairing unit suitable for selecting a target fuse set among the predetermined number of the fuse sets based on the information stored in the storage unit.

In accordance with yet another embodiment of the present invention, an operation method of a memory device includes: generating a count signal sequentially corresponding to a plurality of fuse sets; determining fuse sets that are used in a first operation mode among the plurality of the fuse sets, according to a control signal and the count signal; checking information indicating whether a corresponding fuse set among the plurality of the fuse sets have a failure and whether the corresponding fuse set is used or not, in response to the count signal; and selecting a target fuse set among the determined fuse sets based on the information.

DETAILED DESCRIPTION

Figure 1:
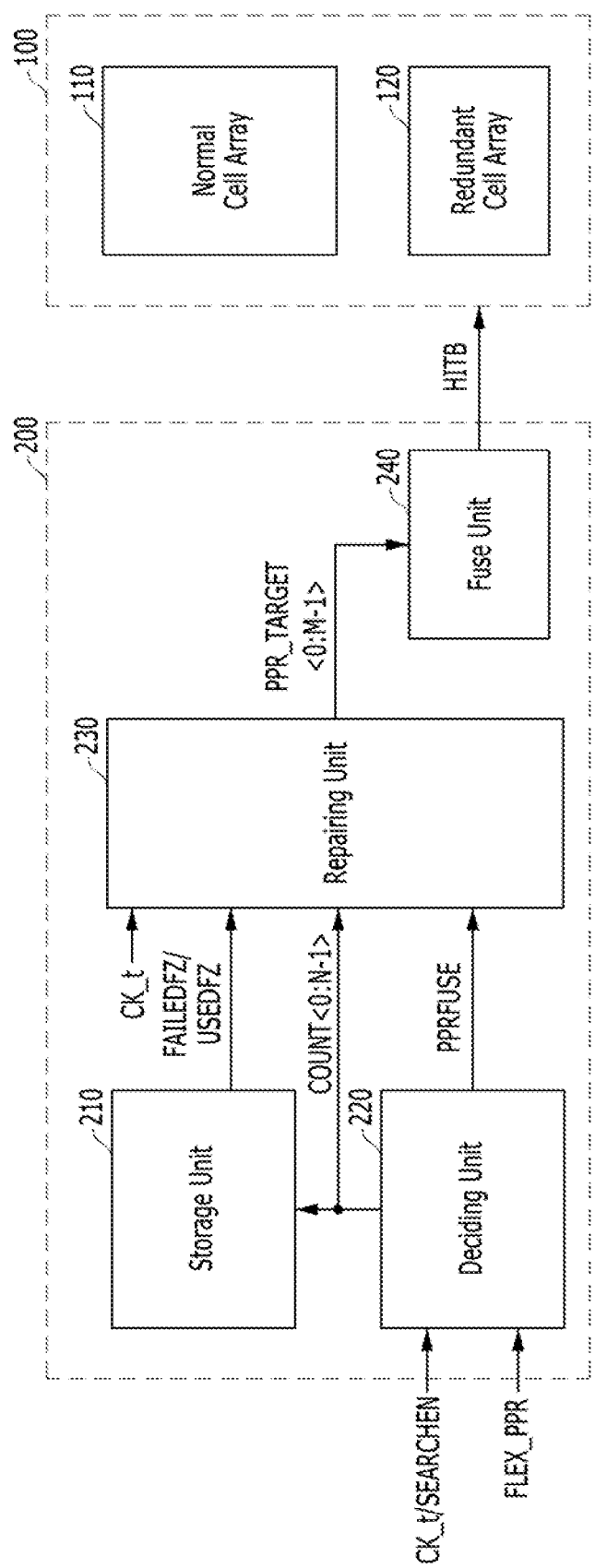
FIG. 1 is a simplified block diagram illustrating a memory device, in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a simplified block diagram illustrating a memory device, in accordance with an embodiment of the present invention.

Referring to FIG. 1, the memory device may include a memory cell region 100 that includes a plurality of memory cells, and a repair circuit 200 for repairing defective memory cells among the memory cells.

The memory cell region 100 may include a normal cell array 110 and a redundant cell array 120. The redundant cell array 120 may include redundant memory cells for substituting defective memory cells among the memory cells of the normal cell array 110. When a defect occurs in a memory cell among the memory cells of the normal cell array 110, a redundant memory cell of the redundant cell array 120 may be selected and used instead of the defective memory cell.

To this end, the repair circuit 200 may include a storage unit 210, a deciding unit 220, a repairing unit 230, and a fuse unit 240.

The fuse unit 240 may include a plurality of fuse sets (not shown) corresponding to the redundant cell array 120. The repair circuit 200 may program an address of the defective memory cell (hereinafter, referred to as "a repair target memory cell") of the normal cell array 110, in each fuse set. Therefore, when a repair target memory cell is accessed, hit signals corresponding to a fuse set where an address of the repair target memory cell is programmed may be enabled, and the repair circuit 200 may combine the enabled hit signals and output a repair signal HITB to the memory cell region 100. After all, instead of the repair target memory cell, a redundant memory cell may be selected and used according to the repair signal HITB.

The repair circuit 200 in accordance with the embodiment of the present invention may detect and manage fuse sets that may be used according to an operation mode of the memory device among a plurality of fuse sets of the fuse unit 240. In other words, the repair circuit 200 may decide fuse sets that are used in a first operation mode of the memory device, select available fuse sets that may be used, among the decided fuse sets, and program the address of the repair target memory cell in the available fuse sets.

The deciding unit 220 may control the number of fuse sets that are used in the first operation mode, among the fuse sets of the fuse unit 240, according to a control signal FLEX_PPR, and output a section signal PPRFUSE representing the fuse sets used in the PPR operation mode. For example, when the control signal FLEX_PPR is enabled, the deciding unit 220 may be able to reduce the number of fuse sets that are used in the first operation mode, among the fuse sets.

The control signal FLEX_PPR may be set differently according to the fabrication process of the memory device. The control signal FLEX_PPR may be set based on a result of a test operation that is performed in the fabrication process of the memory device. For example, when a memory device is tested and relatively many defective memory cells are detected, the control signal FLEX_PPR may be set in a deactivation state, i.e., a logic low level. In this case, the number of the fuse sets that are used in the first operation mode of the memory device may be reduced so as to secure more fuse sets for repairing defective memory cells that are detected during the fabrication process. Therefore, the number of memory chips that are decided as defects may be reduced and the yield of memory devices may be increased.

Conversely, when a relatively small number of defective memory cells are detected, the control signal FLEX_PPR may be set in an activation state, i.e., a logic high level. In this case, the number of the fuse sets that are used in the first operation mode of the memory device may be increased so as to prevent unnecessarily many fuse sets from being secured for repairing defective memory cells that are detected during the fabrication process. In this manner, it is possible to secure a more stable operation and increase the lifespan of a memory device.

The first operation mode may include a post-package repair (PPR) operation mode of a memory device. Also, the control signal FLEX_PPR may be set to a code value which represents a particular number, and stored in a mode register set (MRS) (not shown) of the memory device. The control signal FLEX_PPR may be set according to diverse methods and the method of setting the control signal FLEX_PPR may not be limited to the above-described method.

The storage unit 210 may store information FAILEDFZ denoting whether the respective fuse sets of the fuse unit 240 have a failure or not, and information USEDFZ representing whether the respective fuse sets of the fuse unit 240 are used or not. The storage unit 210 may output the stored information FAILEDFZ and USEDFZ in response to a count signal COUNT<0:N−1> outputted from the deciding unit 220.

The repairing unit 230 may select an available fuse set among the fuse sets used in the first operation mode as a target fuse set, and program the address of the repair target memory cell in the target fuse set, based on the information FAILEDFZ and USEDFZ outputted from the storage unit 210. The repairing unit 230 may operate in response to the count signal COUNT<0:N−1> outputted from the deciding unit 220, combine the information FAILEDFZ and USEDFZ outputted from the storage unit 210 and the section signal PPRFUSE outputted from the deciding unit 220, and output a target signal PPR_TARGET<0:M−1> corresponding to the target fuse set. The specific operations of the constituent elements of the repair circuit 200 will be described below with reference to FIGS. 2 and 3.

Figure 2:
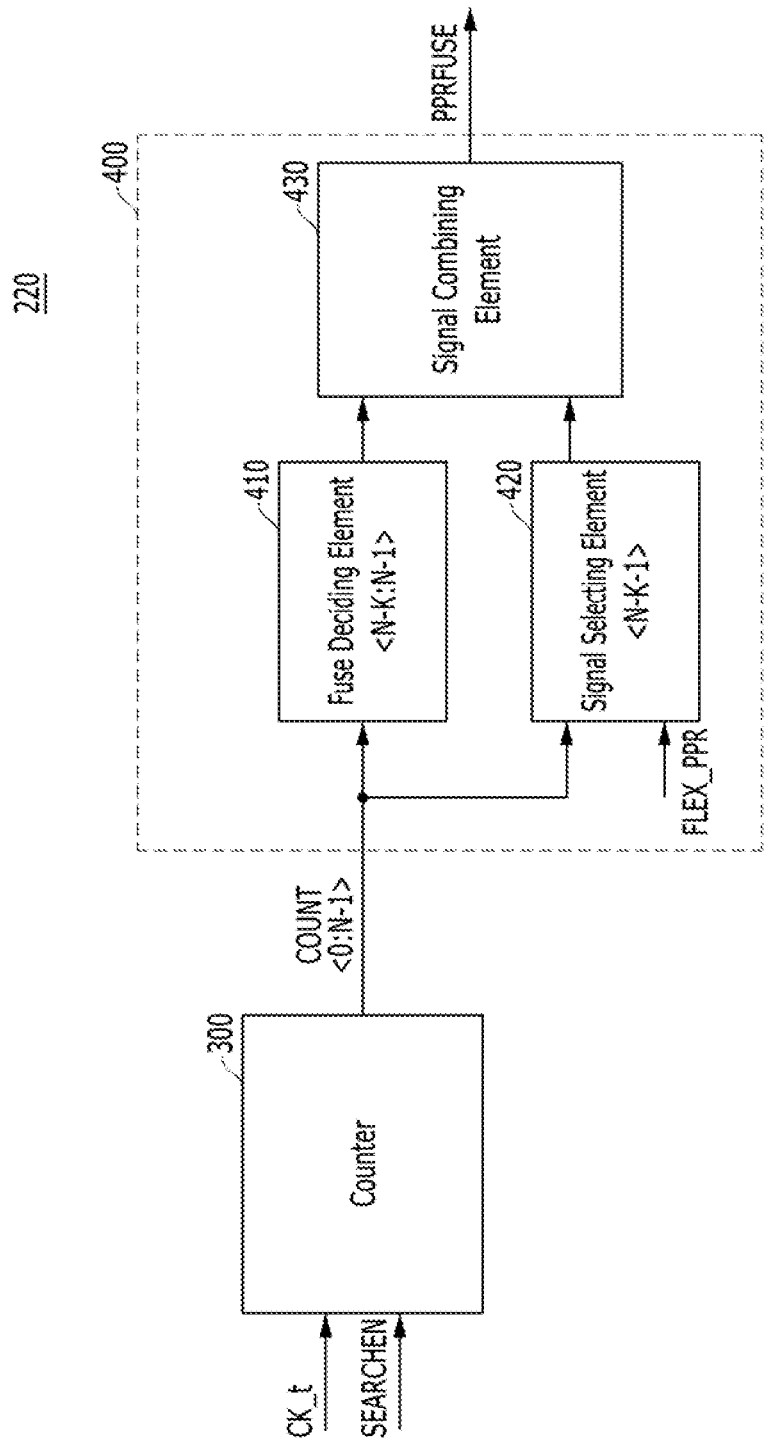
FIG. 2 is a simplified block diagram illustrating an exemplary configuration of a deciding unit shown in FIG. 1.
Figure 3:
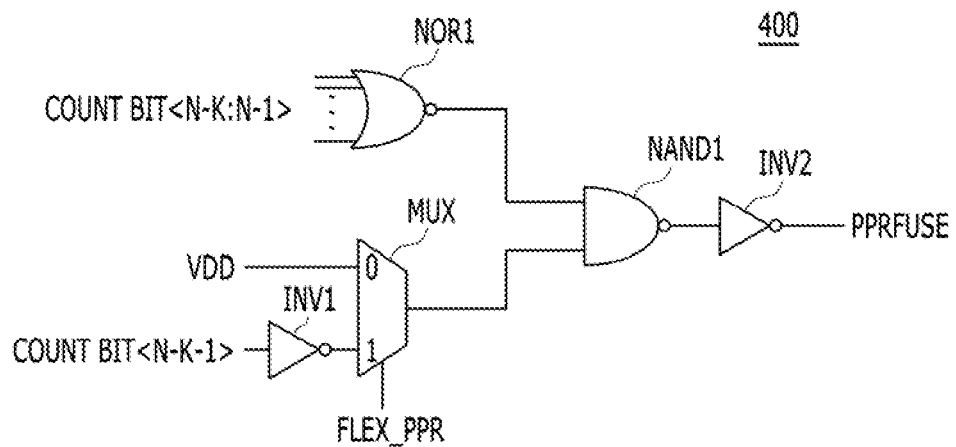
FIG. 3 is an exemplary, simplified circuit diagram of a controller shown in FIG. 2.

FIG. 2 is a simplified block diagram illustrating a structure of the deciding unit 220 shown in FIG. 1. FIG. 3 is an exemplary, simplified circuit diagram illustrating a structure of a controller 400 shown in FIG. 2

Referring to FIG. 2, the deciding unit 220 may include a counter 300 and the controller 400.

The counter 300 may generate an N-bit count signal COUNT<0:N−1> (where N is a natural number) sequentially corresponding to the fuse sets of the fuse unit (240 of FIG. 1) by counting a clock signal CK_t. The count signal COUNT<0:N−1> generated by the counter 300 may be transferred not only to the controller 400 but also to the storage unit (210 of FIG. 1) and the repairing unit (230 of FIG. 1). The counter 300 may count the clock signal CK_t in response to an enable signal SEARCHEN that is activated in a PPR operation mode of the memory device. When a command representing the entry of the PPR operation mode and an address representing the repair target memory cell are inputted from the outside according to the specification of the memory device, the memory device may internally generate the enable signal SEARCHEN.

The controller 400 may generate a section signal PPRFUSE representing the fuse sets that are used in the PPR operation mode, among the fuse sets of the fuse unit 240, by combining some bits of the N bits of the count signal COUNT<0:N−1> according to a control signal FLEX_PPR. The section signal PPRFUSE may be enabled in response to a count signal corresponding to the fuse sets that are used in the PPR operation mode.

Referring to FIG. 2, the controller 400 may include a fuse deciding element 410, a signal selecting element 420, and a signal combining element 430. In FIG. 3, the fuse deciding element 410, the signal selecting element 420, and the signal combining element 430 are illustrated as a circuit structure that may be specifically realized in accordance with an embodiment of the present invention. Hereafter, the operation of the controller 400 may be described with reference to FIGS. 2 and 3.

The fuse deciding element 410 may combine upper K bits COUNTBIT<N−K:N−1> (where K is a natural number smaller than N) among N bits of the count signal COUNT<0:N−1>, and output the combined bits as an output signal. The fuse deciding element 410 may include a first NOR gate NOR1 that receives the upper K bits COUNTBIT<N−K:N−1> of the count signal COUNT<0:N−1>. In short, when all the upper K bits COUNTBIT<N−K:N−1> of the count signal COUNT<0:N−1> have logic low levels, the output signal may be enabled to a logic high level.

The signal selecting element 420 may selectively output an upper $(K+1)^{th}$ bit COUNTBIT<N−K−1> among the N bits of the count signal COUNT<0:N−1> according to the control signal FLEX_PPR. The signal selecting element 420 may include a first inverter INV1 and a multiplexer MUX. The first inverter INV1 may invert a logic level of the upper $(K+1)^{th}$ bit COUNTBIT<N−K−1> of the count signal COUNT<0:N−1> and output the inverted signal. The multiplexer MUX may selectively output an output signal of the first inverter INV1 or a signal of a logic high level corresponding to a source voltage (VDD) level, according to the control signal FLEX_PPR. For example, when the control signal FLEX_PPR has a logic low level, an output signal of the signal selecting element 420 may be set in a logic high level, and when the control signal FLEX_PPR has a logic high level, the signal selecting element 420 may output an output signal of a logic high or low level according to the upper $(K+1)^{th}$ bit COUNTBIT<N−K−1> of the count signal COUNT<0:N−1>.

The signal combining element 430 may combine the output signals of the fuse deciding element 410 and the signal selecting element 420 and output the section signal PPRFUSE. The signal combining element 430 may include a first NAND gate NAND1 and a second inverter INV2. Therefore, when the output signals of the fuse deciding element 410 and the signal selecting element 420 are all in a logic high level, the signal combining element 430 may enable the section signal PPRFUSE to a logic high level and output it.

Figure 4:
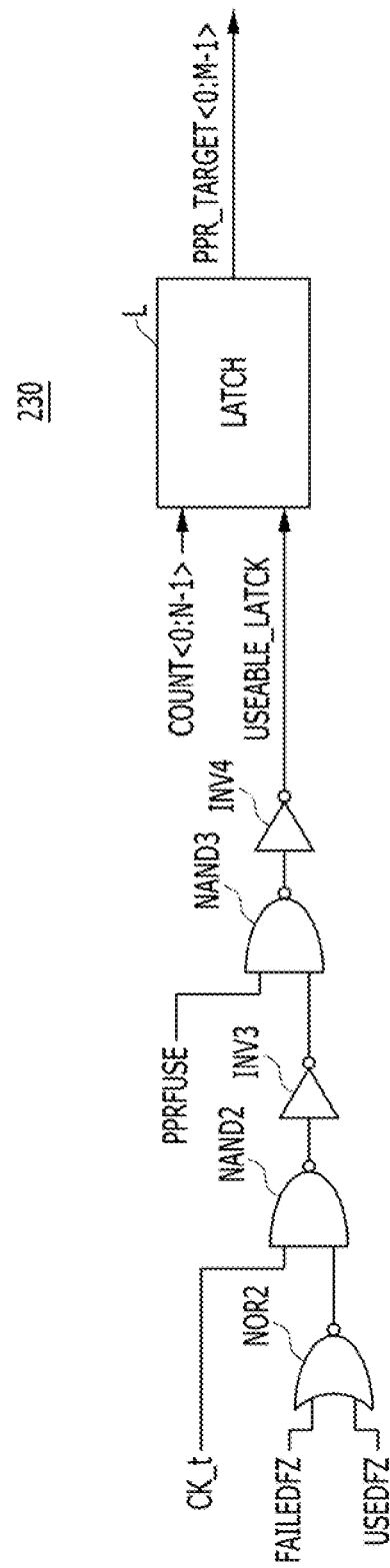
FIG. 4 is an exemplary, simplified circuit diagram of a repairing unit shown in FIG. 1.

FIG. 4 is an exemplary, simplified circuit diagram illustrating a circuit structure of the repairing unit 230 shown in FIG. 1.

The repairing unit 230 may receive the information FAILEDFZ and USEDFZ that is outputted from the storage unit (210 of FIG. 1) in synchronization with the clock signal CK_t. As described earlier, the storage unit 210 may store and output the information FAILEDFZ denoting whether the respective fuse sets among the fuse sets of the fuse unit (240 of FIG. 1) have a failure or not, and the information USEDFZ representing whether the respective fuse sets are used or not, in response to the count signal COUNT<0:N−1>. For example, when the corresponding fuse set is decided as a failure or being used, the information FAILEDFZ and USEDFZ may be set in a logic high level.

Referring to FIG. 4, the repairing unit 230 may include logic gates NOR2, NAND2, NAND3, INV3 and INV4, which output a latch signal USEABLE_LATCK by combining the information FAILEDFZ and USEDFZ outputted from the storage unit 210 and the section signal PPRFUSE outputted from the deciding unit (220 of FIG. 1), and a latch L which outputs a target signal PPR_TARGET<0:M−1> by latching the count signal COUNT<0:N−1> in response to the latch signal USEABLE_LATCK. When the counter 300 is formed of an N-bit counter to count the all the fuse sets of the fuse unit 240, the latch L may be a constituent element for latching N bits or M bits which are smaller than the N bits (MSN).

In a section where the section signal PPRFUSE is enabled, the repairing unit 230 may latch the count signal COUNT<0:N−1> corresponding to a fuse set which is available, among the fuse sets of the fuse unit 240, based on the information FAILEDFZ and USEDFZ, and output the latched count signal as the target signal PPR_TARGET<0:M−1>. For example, in a section where the section signal PPRFUSE is enabled, a fuse set where the information FAILEDFZ and USEDFZ is all set in a logic low level may be set as a target fuse set, and the corresponding count signal COUNT<0:N−1> may be outputted as the target signal PPR_TARGET<0:M−1>.

Hereinafter, referring to FIGS. 1 to 7, an operation of the memory device will be explained.

Figure 5:
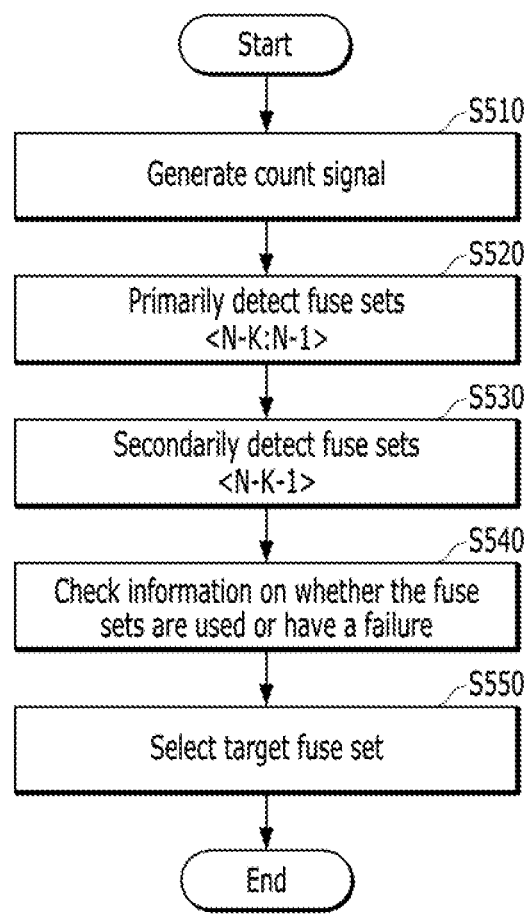
FIG. 5 is a flowchart describing an operation of a memory device, in accordance with an embodiment of the present invention.

FIG. 5 is a flowchart describing an operation of a memory device in accordance with an embodiment of the present invention. The operation includes steps S510 to S550 which are described below.

1) Generate Count Signal (S510)

The counter 300 of the deciding unit 220 may generate the count signal COUNT<0:N−1> sequentially corresponding to the fuse sets of the fuse unit 240. In response to the enable signal SEARCHEN that is enabled when the PPR operation mode begins, the counter 300 may generate the N-bit count signal COUNT<0:N−1> by counting the clock signal CK_t.

2) Detect Fuse Sets (S520 & S530)

In response to the count signal COUNT<0:N−1>, the controller 400 of the deciding unit 220 may detect the fuse sets that are used in the PPR operation mode, among the fuse sets of the fuse unit 240, according to the control signal FLEX_PPR. To be specific, the fuse deciding element 410 may primarily detect the fuse sets corresponding to a lower count value by using the upper K bits COUNTBIT<N−K: N−1> of the count signal COUNT<0:N−1>, in step S520. The signal selecting element 420 and the signal combining element 430 may secondarily detect the fuse sets that are used in the PPR operation mode, among the fuse sets that are primarily detected by the fuse deciding element 410, in step S530.

Herein, the signal selecting element 420 may selectively use the upper $(K+1)^{th}$ bit COUNTBIT<N−K−1> of the count signal COUNT<0:N−1> according to the control signal FLEX_PPR. When the signal selecting element 420 selects the upper $(K+1)^{th}$ bit COUNTBIT<N−K−1> of the count signal COUNT<0:N−1>, the signal combining element 430 may be able to generate the section signal PPRFUSE which represents a count signal section of the count signal COUNT<0:N−1> that corresponds to the fuse sets that are used in the PPR operation mode.

3) Check Information (S540)

The storage unit 210 may store information FAILEDFZ and USEDFZ respectively representing whether the fuse sets are used or have a failure. When the storage unit 210 outputs the information FAILEDFZ and USEDFZ representing whether the fuse sets among the fuse sets of the fuse unit 240 are used or have a failure to the repairing unit 230 in response to the count signal COUNT<0:N−1>, the repairing unit 230 may check the information FAILEDFZ and USEDFZ.

4) Select Target Fuse Set (S550)

The repairing unit 230 may select a target fuse set among the fuse sets that are used in the PPR operation mode based on the information FAILEDFZ and USEDFZ outputted from the storage unit 210. The repairing unit 230 may latch a count signal corresponding to a fuse set which is available, among the count signal COUNT<0:N−1>, based on the information FAILEDFZ and USEDFZ outputted in a section where the section signal PPRFUSE is enabled.

Figure 6:
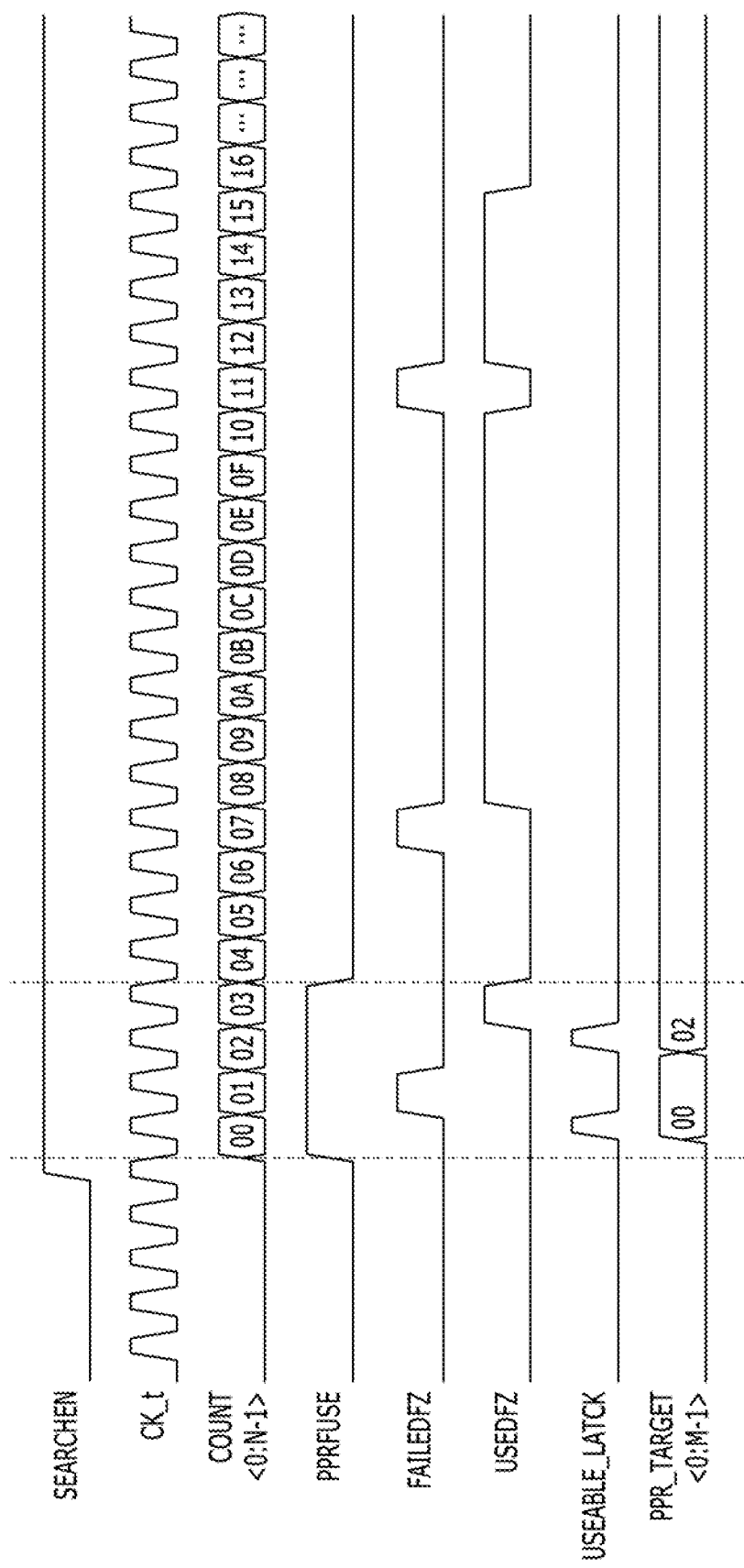
FIGS. 6 and 7 are timing diagrams illustrating an operation of a memory device in accordance with an embodiment of the present invention.
Figure 7:
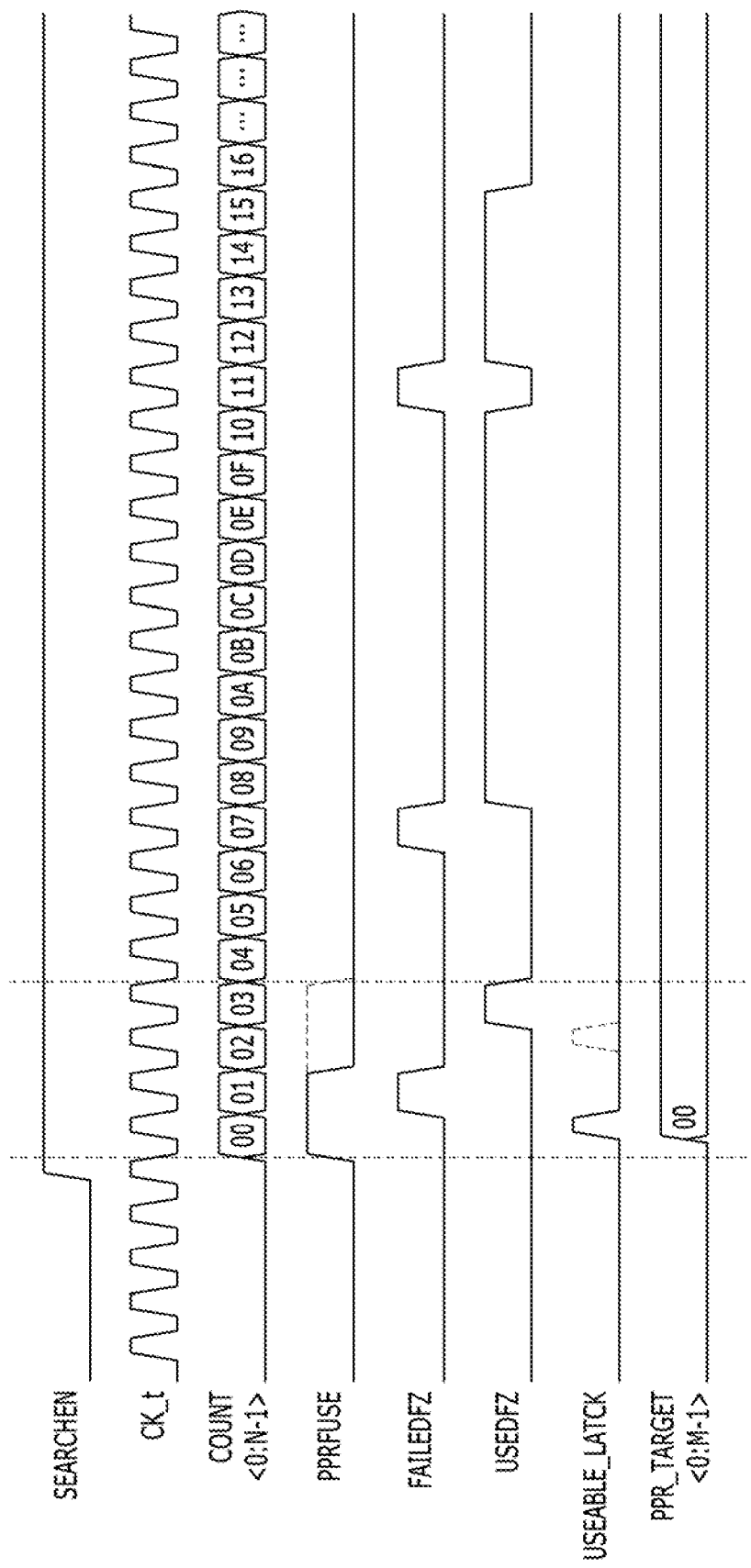

FIGS. 6 and 7 are timing diagrams illustrating an operation of a memory device in accordance with an embodiment of the present invention. FIGS. 6 and 7 show signals of the memory device when the control signal FLEX_PPR is set in a logic low level and a logic high level, respectively.

Referring to FIG. 6, the counter 300 may generate the count signal COUNT<0:N−1> which sequentially increases by counting the clock signal CK_t in response to the enable signal SEARCHEN. Herein, the fuse sets of the fuse unit 240 may be divided into fuse sets that are used during the fabrication process and fuse sets that are used in the PPR operation mode. FIG. 6 shows an example where the first to fourth fuse sets are assigned as the fuse sets that are used in the PPR operation mode according to the specification of the memory device.

Therefore, to generate the section signal PPRFUSE which is enabled for the first to fourth counts "00", "01", "02" and "03" corresponding to lower two bits COUNTBIT<0:1> of the binary-bit count signal COUNT<0:N−1>, the fuse deciding element 410 may combine the remaining upper bits COUNTBIT<2:N−1> of the binary-bit count signal COUNT<0:N−1>, excluding the lower two bits COUNTBIT<0:1>, and may output the combination result. In short, the output signal of the fuse deciding element 410 is outputted in a logic high level only when all the upper bits COUNTBIT<2:N−1> are in the logic low level, and the output signal of the fuse deciding element 410 is outputted in a logic low level in the other cases.

FIG. 6 shows a case where the control signal FLEX_PPR is set in a logic low level. Since the output signal of the signal selecting element 420 is fixed to a logic high level corresponding to a source voltage (VDD) level, the signal combining element 430 may output the output signal of the fuse deciding element 410 as the section signal PPRFUSE. Therefore, the section signal PPRFUSE may be enabled for the first to fourth counts "00", "01", "02" and "03" corresponding to the lower two bits COUNTBIT<0:1> of the count signal COUNT<0:N−1>.

In the section where the section signal PPRFUSE is enabled, the repairing unit 230 may obtain the information FAILEDFZ and USEDFZ outputted from the storage unit 210. When both of the information FAILEDFZ and USEDFZ are in a logic low level, the latch signal USEABLE_LATCK may be generated in synchronization with the clock signal CK_t, and the repairing unit 230 may latch the count signal COUNT<0:N−1> and output the target signal PPR_TARGET<0:M−1> in response to the latch signal USEABLE_LATCK.

FIG. 6 shows an example where the information FAILEDFZ denotes that the second fuse set of the fuse unit 240, corresponding to the second count "01" of the count signal COUNT<0:N−1>, has a failure, and the information USEDFZ represents that the fourth fuse set of the fuse unit 240, corresponding to the fourth count "03" of the count signal COUNT<0:N−1>, is used. After all, the target signal PPR_TARGET<0:M−1> may be generated which corresponds to the first and third counts "00" and "02" of the count signal COUNT<0:N−1>, and the repairing unit 230 may program the address of the repair target memory cell in the first and third fuse sets of the fuse unit 240 based on the generated target signal PPR_TARGET<0:M−1>.

FIG. 7 shows a case where the control signal FLEX_PPR is set in a logic high level. The operation may be performed in the same way until the operation of the fuse deciding element 410. In other words, the output signal of the fuse deciding element 410 may be enabled for the first to the fourth counts "00", "01", "02" and "03" corresponding to the lower two bits COUNTBIT<0:1> of the count signal COUNT<0:N−1>.

However, many defective memory cells may be detected through the test operation that is performed during the fabrication process of the memory device, and thus the control signal FLEX_PPR may be set in a logic high level. The signal selecting element 420 may invert the lower second bit COUNTBIT<1> of the count signal COUNT<0: N−1> and output the inverted signal. Therefore, the signal combining element 430 may be able to output the output signal of the fuse deciding element 410 as the section signal PPRFUSE, only when the lower second bit COUNTBIT<1> of the count signal COUNT<0:N−1> is in a logic low level. The section signal PPRFUSE may be enabled for the first and second counts "00" and "01" corresponding to a lower one bit of the count signal COUNT<0:N−1>.

In the section where the section signal PPRFUSE is enabled, the repairing unit 230 may obtain the information FAILEDFZ and USEDFZ outputted from the storage unit 210. When both of the information FAILEDFZ and USEDFZ are in a logic low level, the latch signal USEABLE_LATCK may be generated in synchronization with the clock signal CK_t, and the repairing unit 230 may latch the count signal COUNT<0:N−1> and output the target signal PPR_TARGET<0:M−1> in response to the latch signal USEABLE_LATCK.

After all, the enable section of the section signal PPRFUSE is decreased by half, and the target signal PPR_TARGET<0:M−1> may be generated corresponding to the first count "00" of the count signal COUNT<0:N−1>, except the second fuse set having a failure. The repairing unit 230 may be able to program the address of the repair target memory cell in the first fuse set of the fuse unit 240 based on the target signal PPR_TARGET<0:M−1>.

According to the embodiments of the present invention, it is possible to flexibly assign fuse sets for supporting a post-package repair (PPR) operation mode, among a plurality of fuse sets of a repair circuit, according to the development of technology for fabricating a memory device and the need of a manufacturer. Therefore, when the number of defects occurring during the fabrication process of a memory device is small, more fuse sets for supporting the PPR operation mode may be assigned to secure the stable operation of the memory device and increase its lifespan. Meanwhile, when there are many defects occurring during the fabrication process of a memory device, many fuse sets to be used during the fabrication process may be secured to reduce the number of memory chips that are decided as failure and hence may increase the yield of making the memory devices.

While the present invention has been described with respect to specific embodiments, it will be apparent to those skilled in the art that various changes and modifications may be made without departing from the spirit and scope of the invention as defined in the following claims.

What is claimed is:
1. A memory device, comprising:
a memory cell region that includes a normal cell array and a redundant cell array;
a fuse unit that includes a plurality of fuse sets corresponding to the redundant cell array, for programming an address of a repair target memory cell of the normal cell array; and
a deciding circuit suitable for determining fuse sets that are used in a first operation mode, among the plurality of the fuse sets, according to a control signal,
wherein the control signal is set in an activation state to increase a number of fuse sets that are used in the first operation mode and the control signal is set in a deactivation state to decrease the number of fuse sets that are used in the first operation mode.

2. The memory device of claim 1, further comprising:
a storage unit suitable for storing information indicating whether the fuse sets have a failure and whether the fuse sets are used or not; and
a repairing circuit suitable for selecting a target fuse set among the determined fuse sets that are used in a first operation mode, and programming the address of the repair target memory cell in the target fuse set, based on the information stored in the storage unit.

3. The memory device of claim 2, wherein the deciding circuit includes:
a counter suitable for generating an N-bit count signal, N being a natural number, sequentially corresponding to the plurality of the fuse sets, by counting a clock signal; and
a controller circuit suitable for generating a section signal corresponding to the determined fuse sets that are used in a first operation mode, by combining a portion of bits of the N-bit count signal according to the control signal.

4. The memory device of claim 3, wherein the controller circuit includes:
a fuse deciding circuit suitable for combining and outputting upper K bits of the N-bit count signal, K being a natural number smaller than N;
a signal selecting circuit suitable for selectively outputting an upper $(K+1)^{th}$ bit of the N-bit count signal according to the control signal; and
a signal combining circuit suitable for combining an output signal of the fuse deciding element and an output signal of the signal selecting element to output a combination result as the section signal.

5. The memory device of claim 4, wherein, when the control signal is enabled, the signal selecting element inverts and outputs the upper $(K+1)^{th}$ bit of the N-bit count signal.

6. The memory device of claim 3, wherein, in response to the N-bit count signal, the storage unit outputs information of a fuse set corresponding to a count of the N-bit count signal, among the plurality of the fuse sets, to the repairing circuit.

7. The memory device of claim 3, wherein, in a section where the section signal is enabled, the repairing circuit latches and outputs a count of the N-bit count signal corresponding to a fuse set which is available, among the determined fuse sets that are used in a first operation mode, based on the information.

8. The memory device of claim 3, wherein:
the information is set in a logic high level, when a corresponding fuse set has a failure or is used; and
the repairing circuit selects a fuse set of which the information is in a logic low level as the target fuse set in a section where the section signal is enabled.

9. The memory device of claim 1, wherein the first operation mode includes a post-package repair mode.

10. A repair circuit, comprising:
a fuse unit that includes a plurality of fuse sets for programming an address of a defective memory cell among a plurality of memory cells;
a storage unit suitable for storing information indicating whether the fuse sets have a failure and whether the fuse sets are used or not;
a deciding circuit suitable for determining a predetermined number of fuse sets among the plurality of the fuse sets, according to a control signal; and
a repairing circuit suitable for selecting a target fuse set among the predetermined number of the fuse sets based on the information stored in the storage unit,
wherein the control signal is set in an activation state to increase a number of fuse sets that are used in the first operation mode and the control signal is set in a deactivation state to decrease the number of fuse sets that are used in the first operation mode.

11. The repair circuit of claim 10, wherein the deciding circuit includes:

a counter suitable for generating an N-bit count signal, N being a natural number, corresponding to the plurality of the fuse sets by counting a clock signal; and a controller circuit suitable for generating a section signal corresponding to the predetermined number of the fuse sets by combining a portion of bits of the N-bit count signal according to the control signal.

12. The repair circuit of claim 11, wherein the controller circuit includes:

a fuse deciding circuit suitable for combining and outputting upper K bits of the N-bit count signal, K being a natural number smaller than N;

a signal selecting circuit suitable for selectively outputting an upper $(K+1)^{th}$ bit among the bits of the N-bit count signal according to the control signal; and a signal combining circuit suitable for combining an output signal of the fuse deciding element and an output signal of the signal selecting element to output a combination result as the section signal.

13. The repair circuit of claim 11, wherein, in response to the N-bit count signal, the storage unit outputs information of a fuse set corresponding to a count of the N-bit count signal, among the plurality of the fuse sets, to the repairing circuit.

14. The repair circuit of claim 11, wherein, in a section where the section signal is enabled, the repairing circuit latches and outputs a count of the N-bit count signal corresponding to a fuse set which is available, among the predetermined number of the fuse sets, based on the information.

15. An operation method of a memory device, comprising:

generating a count signal corresponding to a plurality of fuse sets;

determining fuse sets that are used in a first operation mode, among the plurality of the fuse sets, according to a control signal and the count signal;

checking information indicating whether a corresponding fuse set among the plurality of the fuse sets have a failure and whether the corresponding fuse set is used or not, in response to the count signal; and selecting a target fuse set among the determined fuse sets based on the information, wherein the control signal is set in an activation state to increase a number of fuse sets that are used in the first operation mode and the control signal is set in a deactivation state to decrease the number of fuse sets that are used in the first operation mode.

16. The operation method of claim 15, wherein the generating of the count signal includes:

generating the count signal having N bits, N being a natural number, by counting a clock signal.

17. The operation method of claim 16, wherein the determining of the fuse sets that are used in the first operation mode includes:

primarily determining fuse sets corresponding to lower counts of the count signal by using upper K bits among N bits of the count signal, K being a natural number smaller than N; and secondarily determining the fuse sets that are used in the first operation mode, among the primarily determined fuse sets, by selectively using an upper $(K+1)^{th}$ bit of the count signal according to the control signal.

18. The operation method of claim 17, wherein the secondarily determining of the fuse sets that are used in the first operation mode includes:

generating a section signal which represents a count section of the count signal that corresponds to the fuse sets that are used in the first operation mode.

19. The operation method of claim 18, wherein the selecting of the target fuse set includes:

latching a count of the count signal corresponding to a fuse set which is available, among the determined fuse sets, based on the information in a section where the section signal is enabled.

20. The operation method of claim 15, wherein the first operation mode includes a post-package repair mode.

* * * * *